United States Patent [19]

Takemae

[11] 4,376,989

[45] Mar. 15, 1983

[54] SEMICONDUCTOR DYNAMIC MEMORY

[75] Inventor: Yoshihiro Takemae, Yokohama, Japan

[73] Assignee: Fujitsu Limited, Kawasaki, Japan

[21] Appl. No.: 247,283

[22] Filed: Mar. 25, 1981

[30] Foreign Application Priority Data

Mar. 28, 1980 [JP] Japan ................................ 55-39891

[51] Int. Cl.³ ................................................ G11C 8/00

[52] U.S. Cl. .................................... 365/230; 365/233

[58] Field of Search ............................... 365/230, 233

[56] References Cited

U.S. PATENT DOCUMENTS

| | | | |
|---|---|---|---|
| 3,893,086 | 7/1975 | Nanya | 365/230 |
| 4,110,842 | 8/1978 | Sarkissian et al. | 365/233 |
| 4,272,832 | 6/1981 | Ito | 365/233 |

OTHER PUBLICATIONS

Smith, "Storage Bus Request System", IBM Tech. Disc. Bul., vol. 9, No. 6, 11/66, pp. 619–620.

*Primary Examiner*—Stuart N. Hecker
*Attorney, Agent, or Firm*—Staas & Halsey

[57] ABSTRACT

A semiconductor dynamic memory including a plurality of functional blocks or interface circuits for controlling the memory, such as a row-enable buffer, a row-address buffer, a word decoder, a column-enable buffer, a column-address buffer, and a column decoder. The functional blocks in the semiconductor dynamic memory are sequentially reset by signals from the subsequent functional block so that the power operations of the functional blocks of the subsequent stages is indicated by the reset signal, and thus are returned to the state in which they are ready to execute the next processing.

11 Claims, 13 Drawing Figures

RAS
REB
ROW-ENABLE BUFFER
1
RE
RE
RAB
ROW-ADDRESS BUFFER
RST
2
RA
WD
WORD DECODER
RST
3
WL
SA
SENSE AMPLIFIER
RST
7
BD
CAS
CEB
COLUMN-ENABLE BUFFER
4
CE
CE
CAB
COLUMN-ADDRESS BUFFER
RST
5
CA
CD
COLUMN DECODER
RST
6
D
DB
DATA BUFFER
RST
8
RD
OB
OUTPUT BUFFER
RST
9
DO

0(NS)
50
100
150
200
250
270
(a) $\overline{RAS}$
(b) $\overline{CAS}$
(c) REB
(d) RAB
(e) W D
(f) S A
(g) CEB
(h) CAB
(i) C D
(j) D B
(k) O B
(ℓ) D O
R D
ACTIVE PERIOD
RESET PERIOD Vcc
Vss
CDD
N16
N18
N17
N19
OBD
DBD
CDD
OBD
DBR
N16
N12
N13
t1
t2
t3
t4
t5

SEMICONDUCTOR DYNAMIC MEMORY

FIELD OF THE INVENTION

The present invention relates to a semiconductor dynamic memory which is capable of reducing a cycle time.

BACKGROUND OF THE INVENTION

The dynamic memory essentially requires a reset period. In the conventional dynamic memory in which all of the portions are reset at one time, the cycle time is the sum of a period (access time) including from the start of access of a portion to which the access is made at first to the completion of access of a portion to which the access is finally made and a reset time. On the other hand, the static memory does not require resetting. Therefore, the cycle time of the static memory is nearly equal to the access time. Thus, the dynamic memory having a long cycle time is capable of writing and reading data in a quantity smaller than that of the static memory within a unit period of time.

SUMMARY OF THE INVENTION

An object of the present invention is to provide a semiconductor dynamic memory which removes the drawbacks in the conventional dynamic memory.

Another object of the present invention is to provide a semiconductor dynamic memory which is capable of reducing a cycle time.

A further object of the present invention is to provide a semiconductor dynamic memory having a cycle time which is equal to, or shorter than, an access time.

For achieving the above mentioned object, the present invention deals with a semiconductor dynamic memory comprising a plurality of functional blocks interface circuits such as a row-enable buffer, a row address buffer which receives the output signal from the row enable buffer, a word decoder which is connected to the row address buffer, a group of sense amplifiers which are coupled to word lines connected to the word decoder, a column enable buffer, a column address buffer which receives the output signal from the column enable buffer, a column decoder which receives the column address signal from the column address buffer and which selects one of the sense amplifiers, a data buffer which receives the output of the selected sense amplifier, and an output buffer which is connected to the data buffer. At least one of the functional blocks is reset to be ready to execute the next processing by a signal which is provided from a subsequent functional block and proves that the subsequent function block has begun its operation.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
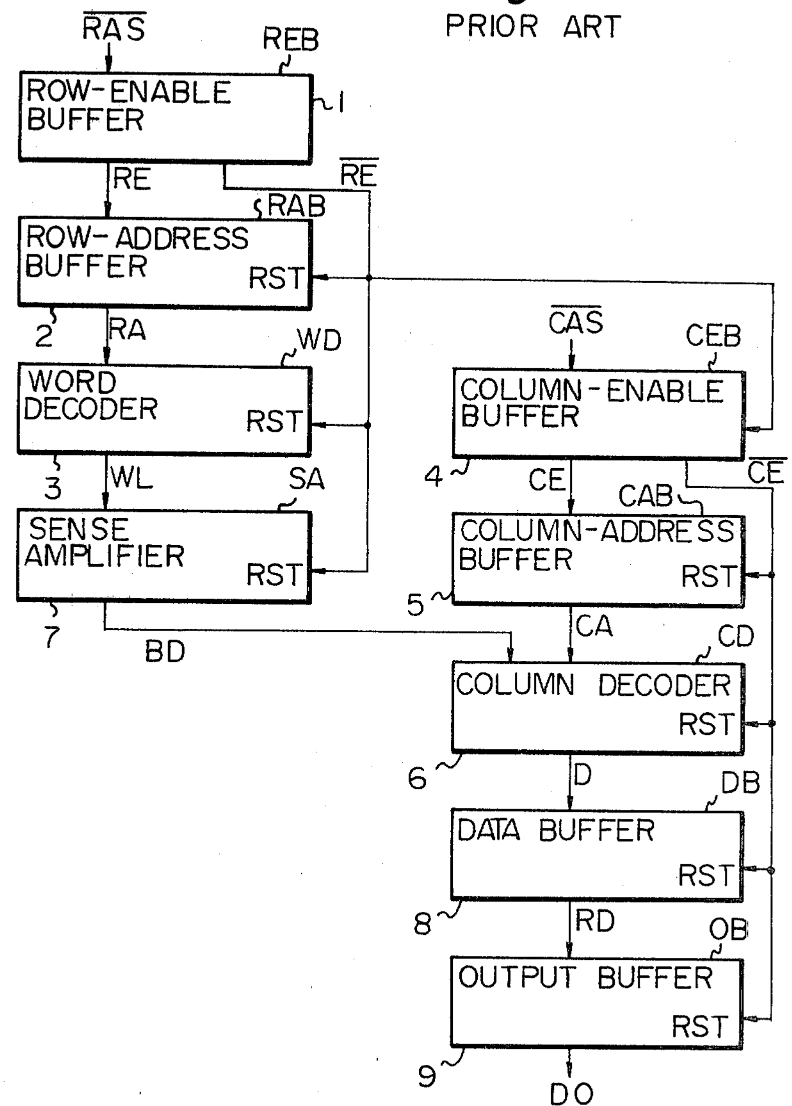
FIGS. 1 and 2 are a block diagram and a time chart illustrating the construction and operation of a major portion of a conventional dynamic memory.
Figure 2:
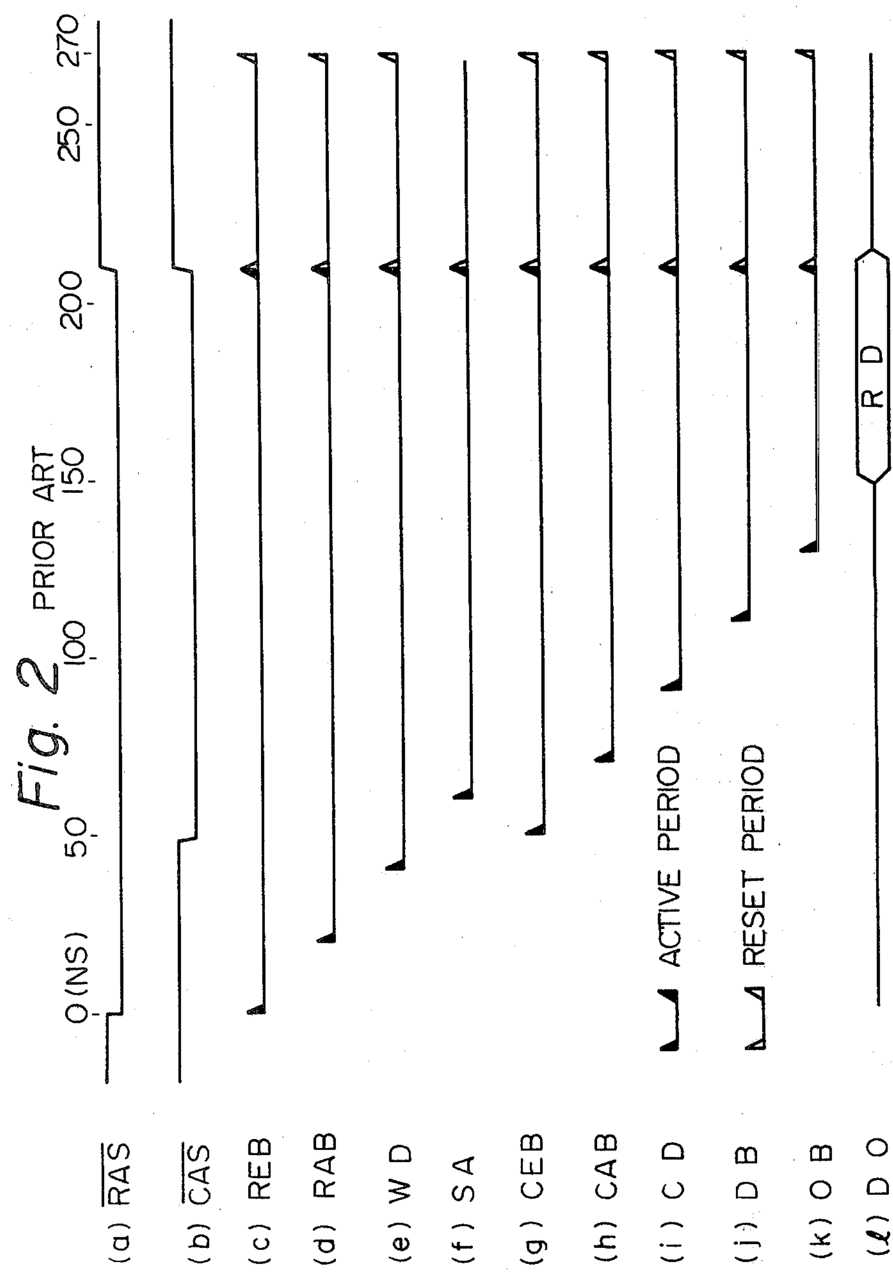

FIGS. 1 and 2 illustrate the construction and operation of a major portion (peripheral circuit) of the interface circuit of the conventional most generally employed dynamic memory. As an inverted signal RAS of a row-address strobe assumes the L (low) level, the circuit in the row system commences to operate, and the row-enable buffer (REB)1, row-address buffer (RAB)2 and word decoder (WD)3 produce outputs RE, RA and WL, successively. Then, as an inverted signal $\overline{CAS}$ of the column-address strobe assumes the L level, the column system commences to operate, whereby the column-enable buffer (CEB)4, column-address buffer (CAB)5 and column decoder (CD)6 produce outputs CE, CA and D, successively. Here, one of the outputs BD of the sense amplifiers 7 produced by the operation of the row system is selected by the column decoder 6, and is converted into a data out DO via data buffer (DB)8 and output buffer (OB)9. At the time when the operation of the output buffer (OB)9 is finished, the inverted signals $\overline{RAS}$ and $\overline{CAS}$ assume the H (high) level. Therefore, the row-enable buffer (REB)1 and column-enable buffer (CEB)4 produce reset signals $\overline{RE}$ and $\overline{CE}$, so that the row enable buffer (RAB), the word decoder (WD), . . . the column address buffer (CAB) and the column decoder (CD) . . . are reset at one time. In FIG. 2, time axis numerals 0, 50, 100, . . . at the upper most line represent the lapse of time in unit of nanoseconds. According to this embodiment, therefore, the cycle time is 270 nanoseconds. On the other hand, the time $t_{RAC}$ from the start of access to a moment at which the read data RD is produced is 150 nanoseconds. Therefore, the cycle time is considerably longer than the time $t_{RAC}$.

Figure 3:
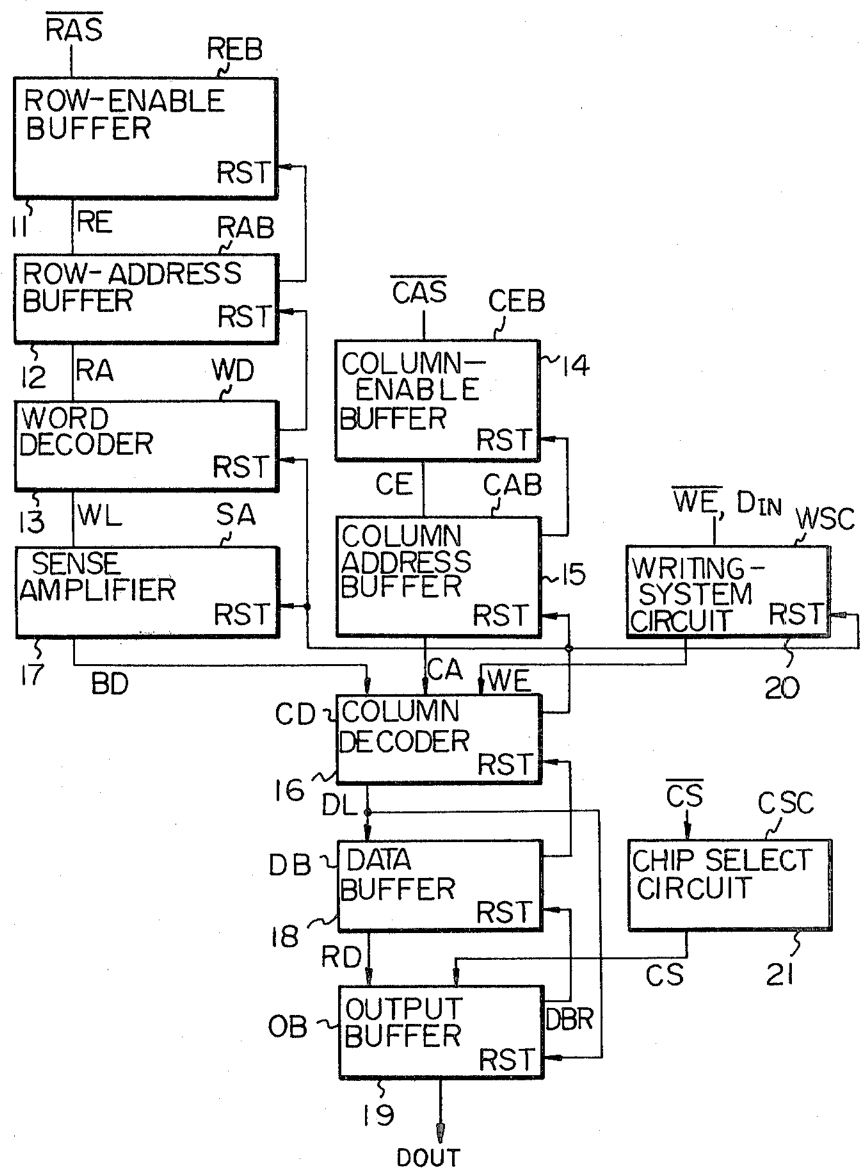
FIGS. 3 and 4 are a block diagram and a time chart illustrating an embodiment and operation according to the present invention.
Figure 4:
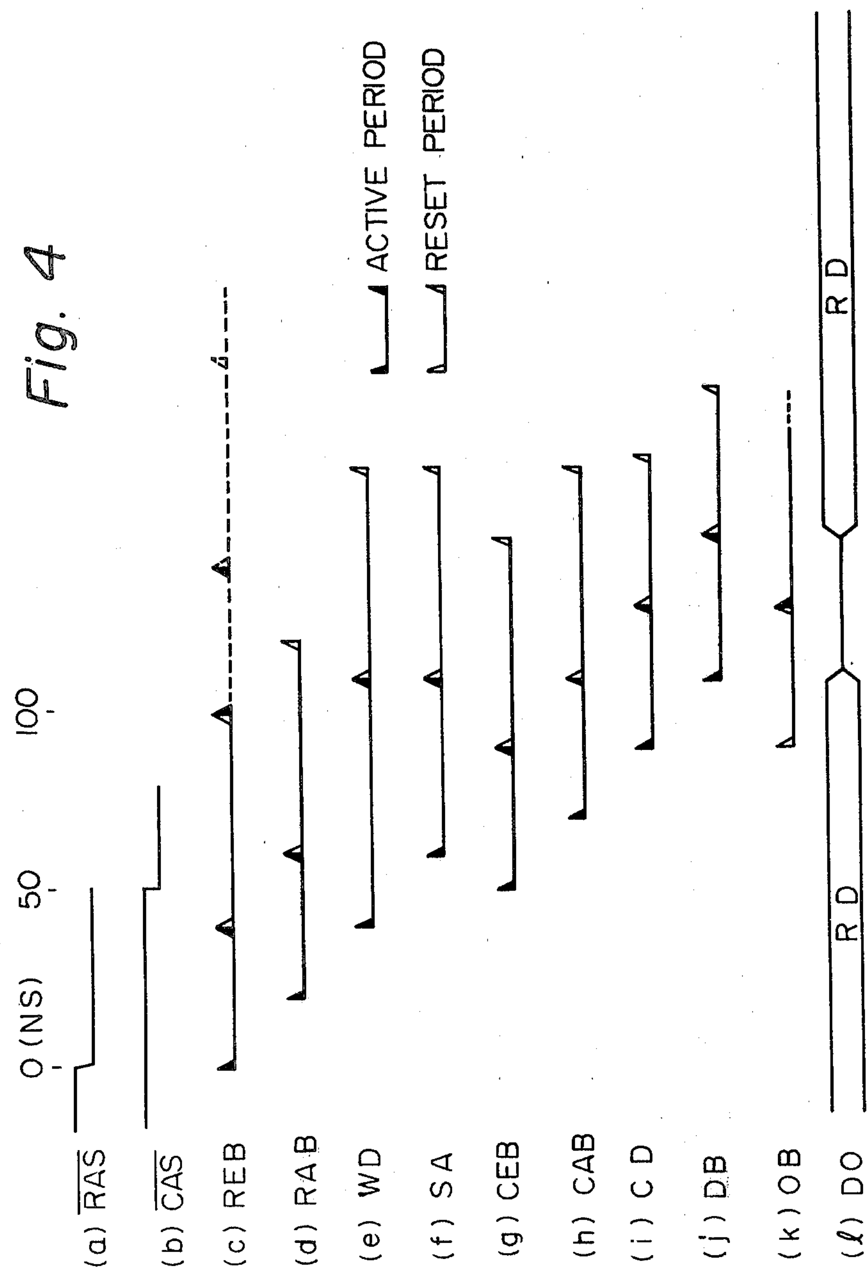

FIGS. 3 and 4 illustrate the construction and operation of the interface circuits of the a major portion of memory according to the present invention. As illustrated in the diagrams, the individual portions according to the present invention are reset immediately after the operation is finished, and are ready to start the next operation. That is, the functional blocks are reset as soon as the subsequent block has begun operation and captured the signal. Namely, the row system and column system commence the operation when the inverted signals $\overline{RAS}$ and $\overline{CAS}$ assume the L level. Here, however, the row-enable buffer (REB)11 is immediately reset by a signal which is caused by the operation of the row-address buffer (RAB)12. The same also holds true for the row-address buffer (RAB)12 and column-enable buffer (CEB)14, without the need of waiting for the return of signals $\overline{RAS}$ and $\overline{CAS}$. Therefore, when the reset is finished, the individual portions enter again into the active period and perform the next operation. Consequently, the cycle time becomes equal to the sum of the active period and the reset time, and is greatly reduced. Although it is difficult to perform the read-modify-write operation, the cycle time is so shortened that there practically arises no problem. Further, the dynamic memory which performs the address multiplex operation, must latch a row address as well as a column address, and hence necessitates two clock signals $\overline{RAS}$ and $\overline{CAS}$. If a column address is latched by utilizing the rise in the clock signal $\overline{RAS}$, however, the clock signal $\overline{CAS}$ need not be employed.

When the writing operation is taken into consideration, the word decoder (WD)13 must be reset after the completion of the operation of the column decoder (CD)16 which is a block of the next but one stage (the second stage—the first one is skipped). Further, the output buffer (OB)19 which generates read data to the output terminal $D_{out}$ receives a reset signal from the column decoder 16 when the column decoder 16 commences operation, starts the resetting operation, and completes the resetting operation while the data buffer (DB)18 is being operated. Thus, with the output buffer 19 being reset, it is possible to retain the read data of the previous cycle up to a moment just before a new read data is produced. In this case, the read data is maintained at the output terminal at all times, and therefore it is not allowed to commonly utilize the output terminal for another memory or to connect the output terminal in parallel with another memory. The output terminal can be connected in parallel with another memory if a chip select circuit (CSC)21 is provided and the output buffer 19 is controlled by the output signal CS. In FIG. 3, reference numeral 20 (WSC) denotes a circuit of the writing system, a signal $\overline{WE}$ denotes an inverted write-enable signal, and a signal $D_{IN}$ denotes a writing data. The time axis numerals 0, 50, 100 . . . shown at the upper most line of FIG. 4 denote the lapse of time (in nanosecond units). The time $t_{RAC}$ from the first access to a moment at which the read data is produced is 150 nanoseconds, the same as the conventional memory shown in FIG. 2. On the other hand, the row enable buffer (REB)11 commences the reset at the time 40 nanoseconds and said reset is completed at the time 100 nanoseconds, so that at the time 100 NS the operation of the next cycle can be carried out. Therefore, one cycle can be completed during 100 nanoseconds. Further, the functional blocks other than the row enable buffer (REB)11 can complete similarly one cycle during 100 nanoseconds. Therefore, the memory can be operated with the cycle time of 100 nanoseconds. This cycle time of 100 nanoseconds is more rapid than that of the conventional memory which requires the cycle time of 270 nanoseconds, so that the function of the memory in the present invention is greatly improved.

Figure 5:
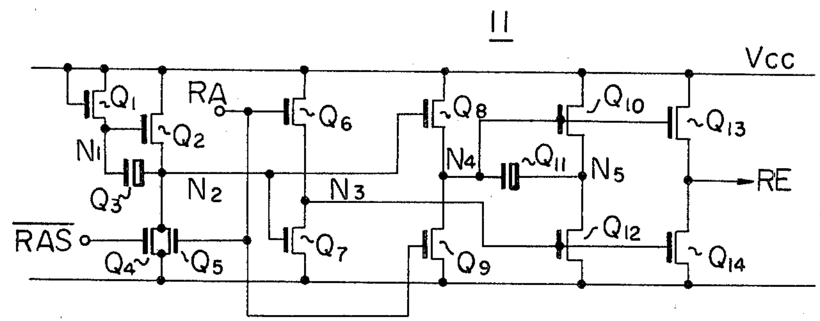
FIGS. 5 and 6 are a diagrams illustrating in detail the row-enable buffer circuit of FIG. 3 and waveforms for illustrating its operation.
Figure 6:
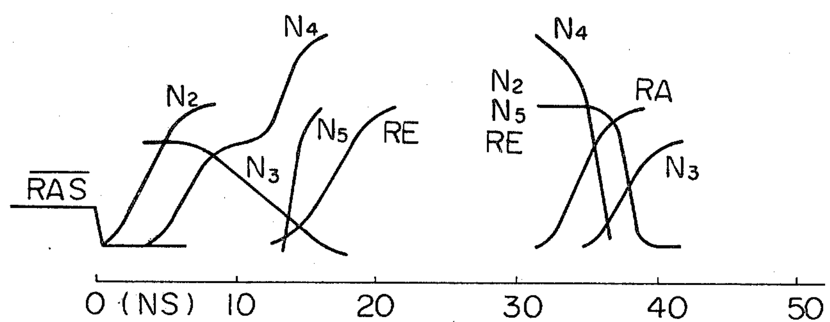

FIGS. 5 and 6 illustrate a circuit and timings with regard to the row-enable buffer (REB)11. Symbols $Q_1$ to $Q_{14}$ denote MOS transistors or MOS capacitors, and $N_1$ to $N_5$ denote nodes or potentials at the nodes. When the inverted signal $\overline{RAS}$ assumes the low level, the node $N_2$ assumes the high level, the transistors $Q_7$ and $Q_8$ are rendered conductive, the node $N_4$ assumes the high level, the node $N_3$ assumes the low level, the transistors $Q_{10}$ and $Q_{13}$ are rendered conductive, the transistors $Q_{12}$ and $Q_{14}$ are rendered non-conductive, and the node $N_5$ and output RE assume the high level. When the output RE assumes the high level, the row-address buffer (RAB)12 operates to produce the output signal RA of the high level. The signal RA is fed back to the row-enable buffer (REB)11 in FIG. 5, whereby the transistors $Q_5$, $Q_6$ and $Q_9$ are rendered conductive, the node $N_2$ assumes the low level, the transistors $Q_7$ and $Q_8$ are rendered non-conductive, the node $N_3$ assumes the high level, the node $N_4$ assumes the low level, the transistors $Q_{10}$ and $Q_{13}$ are rendered non-conductive, the transistors $Q_{12}$ and $Q_{14}$ are rendered conductive, and the node $N_5$ and the output RE assume the low level. Here, since the signal RA is reset by the completion of the operation of word decoder (WD)13, the inverted signal $\overline{RAS}$ must be assumed to be high level before the signal RA is reset. If the inverted signal $\overline{RAS}$ is maintained at the low level, the row-enable buffer (REB)11 commences the next operation when the signal RA is reset.

Figure 7:
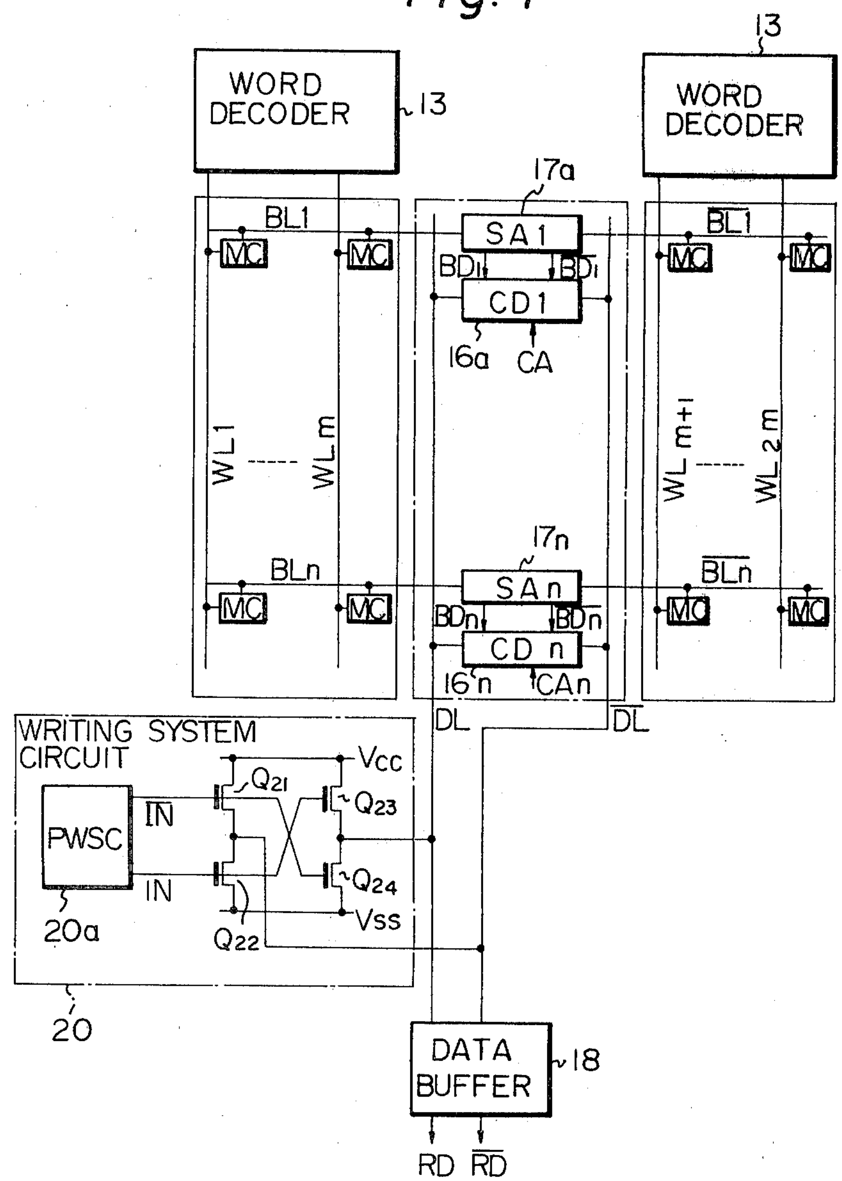
FIG. 7 is a diagram illustrating in detail the word decoder, the sense amplifiers, the column decoder and the writing system circuit shown in FIG. 3.

FIG. 7 illustrates a circuit including the word decoder 13, the column decoder 16, the sense amplifier 17, the data buffer 18 and the writing system circuit 20 in FIG. 3. As seen from FIG. 3, almost all functional blocks receive the reset signal from the next functional block, however, the word decoder (WD)13 should receive the reset signal after the time when the function of the column decoder is completed. Next we will explain the reason why the word decoder (WD)13 should receive the reset signal from the column decoder which is a block of the next but one stage. As illustrated in FIG. 7, the sense amplifier 17 in FIG. 3 is formed by a group of sense amplifiers 17*a*, . . . , 17*n*, the column decoder 16 in FIG. 3 is formed by a group of column decoders 16*a*, . . . , 16*n* and the write system circuit 20 includes a writing circuit 20*a* and a buffer amplifier which includes transistors $Q_{21}$, $Q_{22}$, $Q_{23}$ and $Q_{24}$. In the circuit shown in FIG. 7, the output WL1, . . . , WLm of the word decoder are coupled via memory cells MC and bit lines BL1, . . . , BLn to the sense amplifiers 17*a*, . . . , 17*n*. The column decoder 16*a*, . . . , 16*n* receives the output ($BD_1$, $\overline{BD}_1$, . . . , $BD_n$, $\overline{BD}_n$) from the sense amplifiers 17*a*, . . . , 17*n* and the output signal CA from the column address buffer 15, and the output signal of the column decoder 16*a*, . . . , 16*n* are coupled via data lines DL and $\overline{DL}$ to the data buffer 18. In the reading operation, the word decoder (WD)13 selects one of the word lines $WL_1 \sim WL_{2m}$ and the data of the memory cells which are connected to the selected word line are transmitted to the bit lines and amplified by the sense amplifiers $SA_1 \sim SA_n$, and only the data which is selected by the column decoder $CD_1 \sim CD_n$ is transmitted to the lines DL and $\overline{DL}$. When the reading operation is carried out in such a manner, the word decoder (WD)13 can be reset after the data of the memory cells are transmitted to the bit lines and amplified by the sense amplifiers. Therefore, it is not necessary to await the operation of the column decoder (CD)16 when executing the reading operation. Contrariwise, in the writing operation, the data which is written in the lines DL and $\overline{DL}$ by the writing system circuit 20 is written via the column decoder sense amplifiers and the bit lines in the memory cell which is selected by the word lines. Therefore, the word lines can not be reset till the time when the column decoder is operated and the data is written in the memory cells via the lines DL and $\overline{DL}$ and the bit lines. This is the reason why the word decoder (WD)13 receives the reset signal from the column decoder (CD)16.

As shown in FIG. 3, different from the other blocks or interface circuits, the output buffer (OB)19 receives the reset signal from the column decoder 16 which is two stages from the output buffer 19. This is due to the reason that the read data is maintained at the output terminal $D_{out}$ till the next data is output at said output terminal $D_{out}$. If it is not necessary to output the data before the next data is output, the chip select circuit (CSC)21 may control the output buffer (OB)19 so as to disable the output $D_{out}$. For the purpose of explaining the method for resetting the output buffer (OB)19, a more detailed functional block diagram of the column decoder, the data buffer and the output buffer are shown in FIGS. 8A~8C.

Figure 8A:
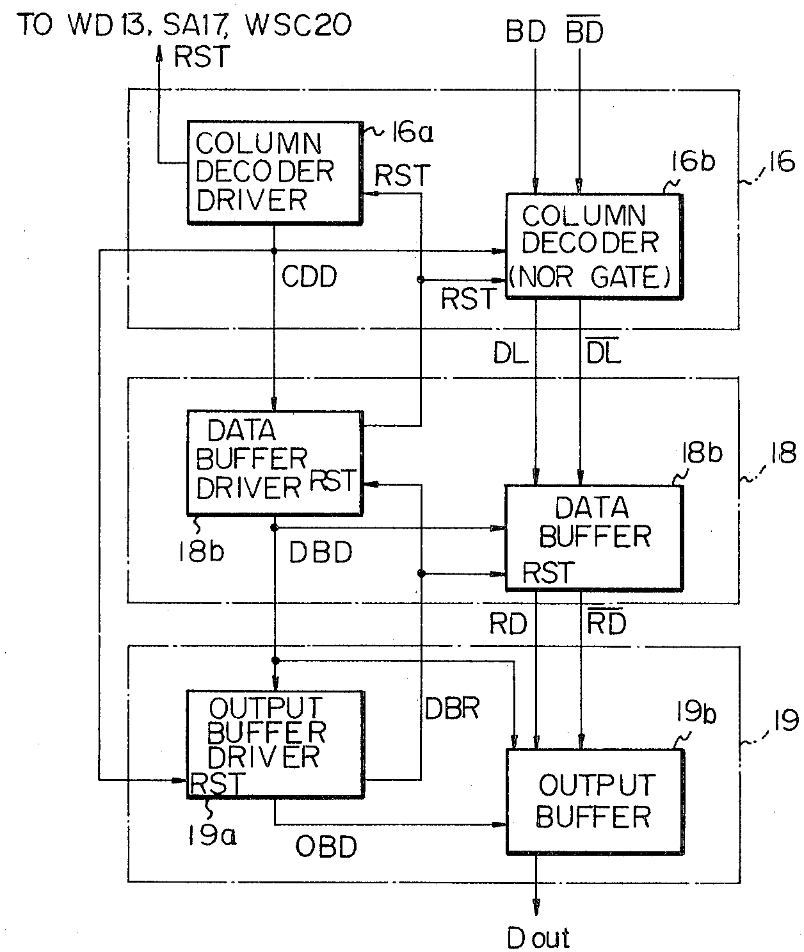
FIGS. 8A, 8B and 8C are diagrams illustrating in detail the column decoder, the buffer data and the output buffer shown in FIG. 3.

The column decoder 16 shown in FIG. 3 includes a column decoder driver 16*a* and a column decoder 16*b* as shown in FIG. 8A, the data buffer 18 shown in FIG. 3 includes a data buffer driver 18*a* and a data buffer 18*b* as shown in FIG. 8A, and the output buffer 19 shown in FIG. 3 includes an output buffer driver 19*a* and an output buffer 19*b*. The reset signal is supplied from the column decoder driver 16*a* to the word decoder 13, the sense amplifier 17 and the writing system circuit, the data buffer driver 18*a* generates a reset signal for the column decoder driver 16*a* and the column decoder 16*b*. The reset of the output buffer 19 is commenced by the output signal CDD of the column decoder driver 16*a*. On the other hand, the data buffer 18 commences operation by the signal CDD, so that the output buffer driver 18*b* is reset during the operation of the data buffer 18*b*. When the output buffer driver 18*b* is reset, the output OBD of the output buffer driver 18*b* is also reset so that the output buffer 19*b* is reset at the same time. The output buffer driver 19*a* and the output buffer 19*b* are competely reset till the time when the data buffer driver 18*b* outputs the output signal DBD. Therefore, the output buffer 19*b* can receive the signal DBD and the read data RD and $\overline{RD}$, so that the output buffer 19 commences operation and supplies the read data at the output terminal $D_{out}$. At the same time when the operation of the output buffer driver 19*a* is completed, the signal DBR is generated so as to reset the data buffer 18. This signal DBR is automatically reset by the timing circuit included in the output buffer driver 19*a* at about the time when the data buffer 18 is completely reset by the signal DBR. On the other hand, the output signal OBD of the output buffer driver 19*a* is maintained till the time when the output buffer driver receives the signal CDD in the next cycle so that the read data is maintained at the output terminal $D_{out}$.

Figure 8B:
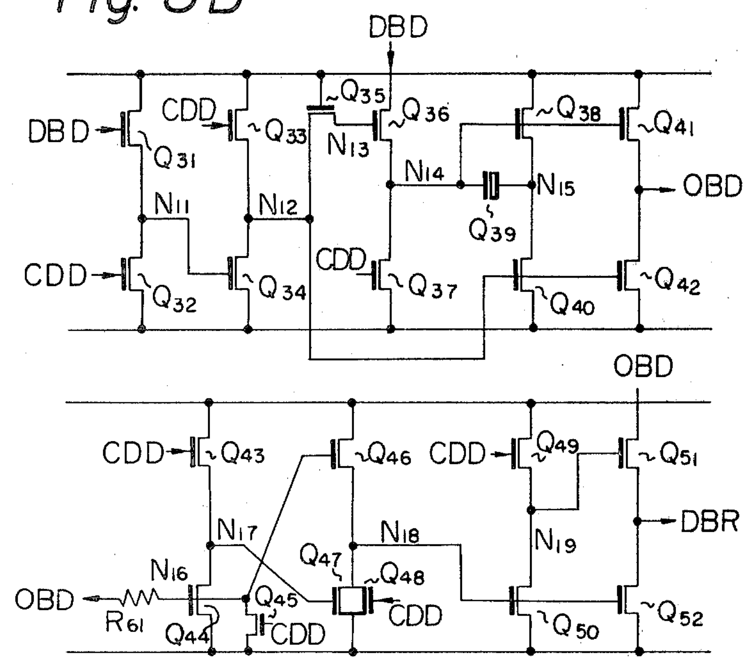
Figure 8C:
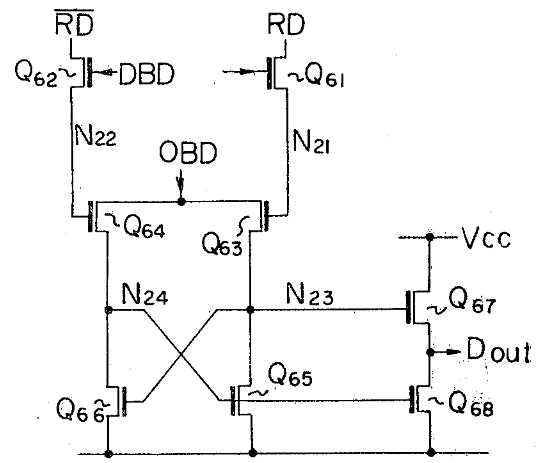
Figure 9A:
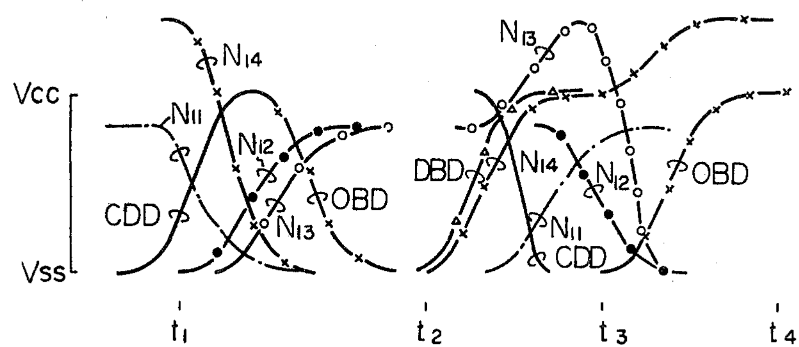
FIGS. 9A, 9B and 9C are diagrams illustrating waveforms for illustrating the operation of the circuit shown in FIGS. 8A, 8B and 8C.

FIG. 8B is a circuit of the output buffer driver 19*a*, symbols $Q_{31}$ through $Q_{52}$ denote MOS transistors or MOS capacitors and symbols $N_{11}$ through $N_{19}$ denote nodes or potentials at the nodes. The circuit which is formed by the transistors $Q_{31}$~$Q_{42}$ is the circuit which forms the signal OBD. The timing chart of this circuit is shown in FIG. 9A. At first, when the signal CDD is placed in the high level, the potential in the nodes $N_{12}$ and $N_{13}$ is placed in the high level and the potential in the node $N_{14}$ is placed in the low level so that this circuit is reset, the transistor $Q_{41}$ is placed in the off state, the transistor $Q_{42}$ is placed in the on state and the signal OBD is placed in the low level state. After the reset is completed, at the time $t_2$, the signal DBD is placed in the high level and the signal CDD is placed in the low level so that this circuit commences operation.

When node $N_{14}$ is placed in the high level and the node $N_{12}$ is placed in the low level, the transistor $Q_{41}$ is placed in the on state, the transistor $Q_{42}$ is in the off state, the signal OBD is placed in the high level so that the output buffer 19*b* is driven.

Figure 9C:
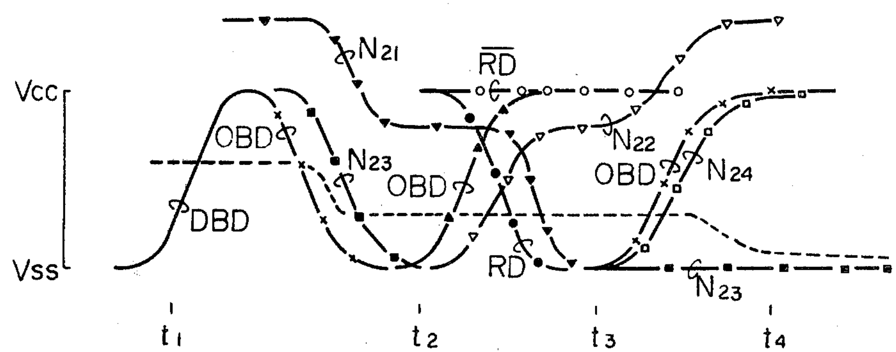
Figure 9B:
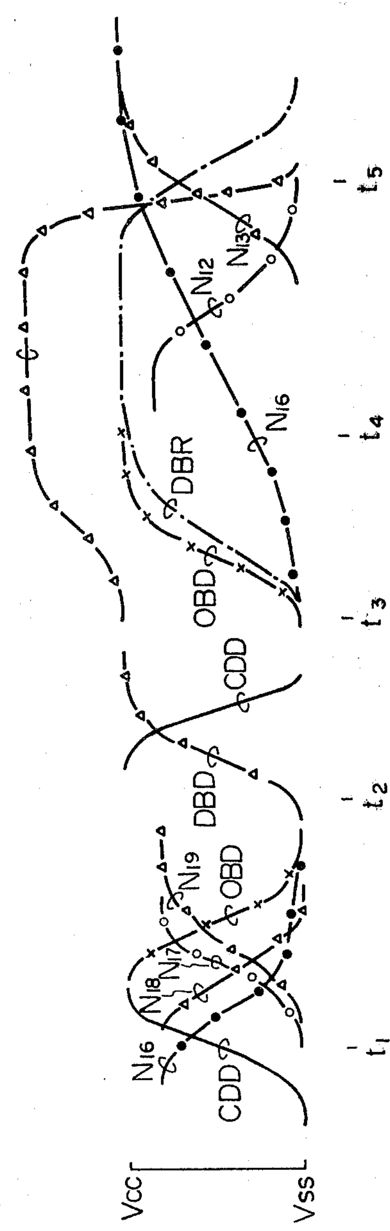

The circuit which includes the transistors $Q_{43}$~$Q_{52}$ and the resistor $R_{61}$ is the circuit for forming the signal DBR and the timing chart of this circuit is shown in FIG. 9B. This circuit is reset by the signal CDD. After this circuit is reset, when the signal OBD is placed in the high level, the signal DBR is also placed in the high level. Thereafter, the node $N_{18}$ is placed in the high level by the timing circuit including the transistors $Q_{43}$~$Q_{48}$ and the resistor $R_{61}$. Therefore, the transistor $Q_{50}$ is placed in the on state, the node $N_{19}$ is placed in the low level and the transistor $Q_{51}$ is placed in the off state. On the other hand, the transistor $Q_{52}$ is placed in the on state so that the signal DBR is placed at the low level via the transistor $Q_{52}$. FIG. 8C is a circuit of the output buffer 19*b*, symbols $Q_{61}$ through $Q_{68}$ denotes MOS transistors and symbols $N_{21}$ through $N_{24}$ denote nodes or potentials at the nodes. The time chart of the output buffer 19*b* is shown in FIG. 9C. At the time $t_1$, the node $N_{23}$ is placed at the high level and the transistor $Q_{67}$ is placed in the on state therefore the high level is output at the output terminal $D_{out}$. At the time $t_2$, the signal OBD is placed in the low level, the potential of node $N_{23}$ is discharged via the transistor $Q_{63}$ to the signal OBD, the transistor $Q_{67}$ is placed in the off state and is reset. At the time $t_3$, the potential levels of the nodes $N_{21}$ and $N_{22}$ are determined by the signal RD, $\overline{RD}$. That is, one of the nodes $N_{21}$ and $N_{22}$ is placed at the high level and another of them is placed in the low level. In the example shown in FIG. 9C, the node $N_{22}$ is in the high level and the node $N_{21}$ is in the low level. Thereafter, when the signal OBD is placed at the high level, as the transistor $Q_{64}$ is in the on state, the node $N_{24}$ is placed in the high level, so that the transistor $Q_{63}$ is placed in the on state. On the other hand, if the signal OBD is placed in the high level, the transistor $Q_{63}$ is in the off state, therefore, the node $N_{23}$ is maintained at the low level and the transistor $Q_{67}$ is in the off state. Therefore, the output $D_{out}$ is placed in the low level state.

According to the present invention as illustrated in the foregoing, the individual functional blocks or interface circuits (except the output buffer) which have finished the operation, are readily reset by the signals of functional block of the next stage or of the next but one stage. And, the output buffer which maintains last read data on terminal $D_{out}$ is reset with a signal from the column decoder just before the output buffer commences the new operation. Therefore, it is possible to greatly reduce the cycle time of the dynamic memory and, eventually, to write and read large amounts of data within reduced periods of time.

I claim:

1. A semiconductor dynamic memory comprising a plurality of interface circuits including:

a row-enable buffer for generating a row enable output signal;

a row address buffer, operatively connected to receive the row enable output signal from said row enable buffer;

a word decoder operatively connected to said row address buffer;

word lines operatively connected to said word decoder;

a group of sense amplifiers, operatively connected to said word lines, for generating a sense output signal;

a column enable buffer for generating a column enable output signal;

a column address buffer, operatively connected to receive the column enable output signal from said column enable buffer, for generating a column address signal in dependence upon the column enable output signal;

a column decoder operatively connected to receive the column address signal from said column address buffer and which column address signal selects one of said sense amplifiers;

a data buffer operatively connected to receive the sense output signal of the selected sense amplifier; and an output buffer operatively connected to said data buffer, at least one of said interface circuits being reset, so as to be ready to execute the next processing, by a reset signal which is generated by a connected interface circuit which receives an output signal generated by the at least one interface circuit and the reset signal proves that said connected interface circuit has begun its operation.

2. A semiconductor dynamic memory according to claim 1, wherein said row address buffer and said word decoder generate first and second signals, wherein said row enable buffer is reset by the first signal generated by said row address buffer, and said row address buffer is reset by the second signal generated by said word decoder.

3. A semiconductor dynamic memory according to claim 1 or 2, wherein said column decoder generates a third signal, wherein both said word decoder and said sense amplifier are reset by the third signal generated by said column decoder.

4. A semiconductor dynamic memory according to claim 1 or 2, wherein said column decoder generates a fourth signal, wherein said output buffer is reset by the fourth signal generated by said column decoder.

5. A semiconductor dynamic memory according to claim 1 or 2, wherein said semiconductor dynamic memory is operatively connected to receive an external clock signal having a rising edge and a falling edge, wherein said row-enable buffer commences operation in dependence upon the rising edge or a falling edge of the external clock signal and said column-enable buffer commences operation in dependence upon the falling edge or the rising edge of said external clock signal in dependence upon which edge of the external clock signal initiates operation of said row enable buffer.

6. A semiconductor dynamic memory according to claim 3, wherein column decoder generates a fourth signal which resets said output buffer.

7. A semiconductor dynamic memory according to claim 3 wherein said semiconductor dynamic memory is operatively connected to receive an external signal having a rising edge and a falling edge, wherein said row-enable buffer commences operation in dependence upon the rising edge or the falling edge of the external clock signal and said column-enable buffer commences operation in dependence upon the falling edge or the rising edge of said external clock signal in dependence upon which edge of the external clock signal initiates operation of said row-enable buffer.

8. A semiconductor dynamic memory according to claim 4, wherein said semiconductor dynamic memory is operatively connected to receive an external clock signal having a rising edge and a falling edge, wherein said row-enable buffer commences operation in dependence upon the rising edge or the falling edge of the external clock signal and said column-enable buffer commences operation in dependence upon the falling edge or the rising edge of said external clock signal in dependence upon which edge of the external clock signal initiates operation of said row-enable buffer.

9. A semiconductor dynamic memory, operatively connectable to receive a row address strobe signal, a column address strobe signal and a write enable signal, comprising:

a row-enable buffer, operatively connectable to receive the row address strobe signal, for generating a first signal in dependence upon the row address strobe signal;

a row address buffer, operatively connected to said row-enable buffer, for generating a first reset signal and a second signal in dependence upon the first signal, said row-enable buffer being reset by the first reset signal;

a word decoder operatively connected to said row address buffer, for generating a second reset signal and a third signal in dependence upon the second signal, said row address buffer being reset by the second reset signal;

a sense amplifier, operatively connected to said word decoder, for generating a fourth signal in dependence upon the third signal;

a column enable buffer, operatively connectable to receive the column address strobe signal, for generating a fifth signal in dependence upon the column address strobe signal;

a column address buffer, operatively connected to said column enable buffer, for generating a third reset signal and a sixth signal in dependence upon the fifth signal, said column enable buffer being reset by the third reset signal;

a writing system circuit, operatively connectable to receive the write enable signal, for generating a seventh signal in dependence upon the write enable signal;

a column decoder, operatively connected to said word decoder, said sense amplifier, said column address buffer and said writing system circuit, for generating a fourth reset signal and an eighth signal in dependence upon the fourth, sixth and seventh signals, said word decoder, said sense amplifier, said column address buffer and said writing system circuit being reset by said fourth reset signal;

a data buffer, operatively connected to said column decoder, for generating a fifth reset signal and a ninth signal in dependence upon the eighth signal, said column decoder being reset by said fifth reset signal; and an output buffer, operatively connected to said data buffer and said column decoder, for generating output data and a sixth reset signal in dependence upon the ninth signal, said data buffer being reset by the sixth reset signal and said output buffer being reset by the eighth signal.

10. A semiconductor dynamic memory as recited in claim 9, wherein said column strobe signal is the row address strobe signal.

11. A semiconductor dynamic memory according to claim 9 or 10, wherein said semiconductor dynamic memory is operatively connectable to receive a chip select signal and further comprises a chip select circuit, operatively connectable to receive the chip select signal, for generating a tenth signal in dependence upon the chip select signal, wherein said output buffer generates the output data and the sixth reset signal in dependence upon the ninth signal and the tenth signal.

* * * * *

UNITED STATES PATENT AND TRADEMARK OFFICE
CERTIFICATE OF CORRECTION

PATENT NO. : 4,376,989

DATED : March 15, 1983

INVENTOR(S) : Takemae

It is certified that error appears in the above—identified patent and that said Letters Patent is hereby corrected as shown below:

Front page, [57] ABSTRACT, line 8, "power" should be --proper--;
Front page, [57] ABSTRACT, line 8, "operations" should be --operation--.
Column 1, line 39, before "interface" insert --or--;
Column 1, line 54, "function" should be --functional--.
Column 2, line 1, delete "a";
Column 2, line 18, "circuit" should be --circuits--;
Column 2, line 19, "RAS" should be --$\overline{RAS}$--;
Column 2, line 42, "unit" should be --units--;
Column 2, line 50, delete "the interface circuits of the";
Column 2, line 50, insert after "of" (third occurrence) --the interface circuits of the--.
Column 6, line 13, "denotes" should be --denote--.

Signed and Sealed this

*Second* Day of *August 1983*

[SEAL]

*Attest:*

GERALD J. MOSSINGHOFF

*Attesting Officer* *Commissioner of Patents and Trademarks*